United States Patent [19]

Kikuchi

[11] Patent Number: 4,775,835
[45] Date of Patent: Oct. 4, 1988

[54] MAGNETIC RESONANCE IMAGING APPARATUS INCLUDING SEQUENCE CONTROLLER

[75] Inventor: Naoshi Kikuchi, Narashino, Japan

[73] Assignee: Kabushiki Kaisha Toshiba, Kawasaki, Japan

[21] Appl. No.: 31,283

[22] Filed: Mar. 30, 1987

[30] Foreign Application Priority Data

Mar. 31, 1986 [JP] Japan .................................. 61-72911

[51] Int. Cl.⁴ .......................................... G01R 33/20
[52] U.S. Cl. .................................... 324/312; 324/307
[58] Field of Search ............... 324/300, 307, 309, 308, 324/312, 313, 314; 364/200, 900

[56] References Cited

U.S. PATENT DOCUMENTS

| | | | |
|---|---|---|---|
| 4,191,919 | 3/1980 | Haney et al. .................. | 324/312 |
| 4,318,043 | 3/1982 | Crooks . | |
| 4,471,306 | 9/1984 | Edelstein . | |
| 4,525,673 | 6/1985 | Berkowitz .................... | 324/312 |
| 4,620,153 | 10/1986 | Hino .................................. | 324/309 |
| 4,689,564 | 8/1987 | Leue et al. ..................... | 324/313 |

FOREIGN PATENT DOCUMENTS 60-158849 7/1985 Japan .

Primary Examiner—Michael J. Tokar
Attorney, Agent, or Firm—Oblon, Fisher, Spivak, McClelland & Maier

[57] ABSTRACT

A magnetic resonance imaging apparatus includes a sequence controller. The sequence controller includes an event memory for storing a plurality of data subsets useful for applying magnetic fields and radio frequency (RF) pulses to a body under medical examination, each of the data subsets containing event data, time data for performing the event data and control data for controlling execution of the event data. It further includes a reference time generator, a comparator for comparing the reference time with the time data sequentially read from the event memory within one reference time period, and a control circuit for sequentially controlling an application of the magnetic fields and RF pulses to the body, and data acquisition based upon the event data and control data whenever the time data is coincident with the reference time data judged by the comparator.

7 Claims, 6 Drawing Sheets

F I G. 4
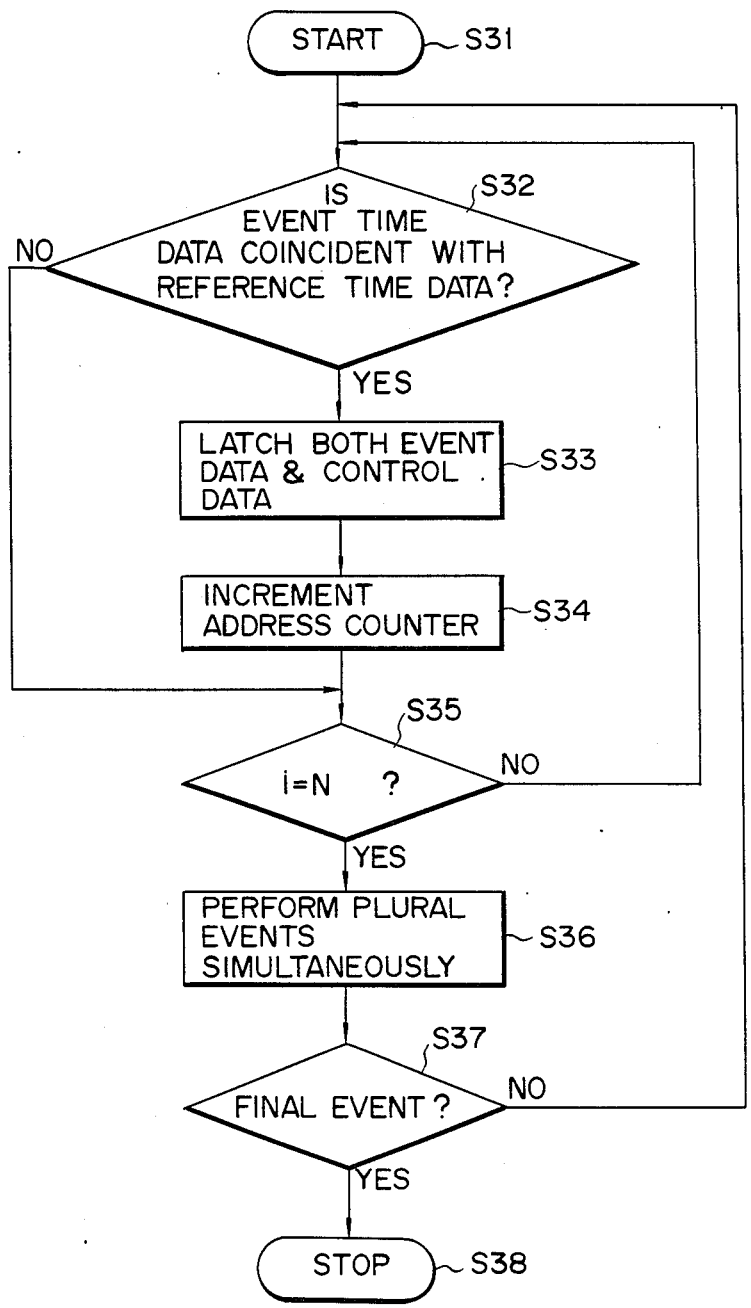

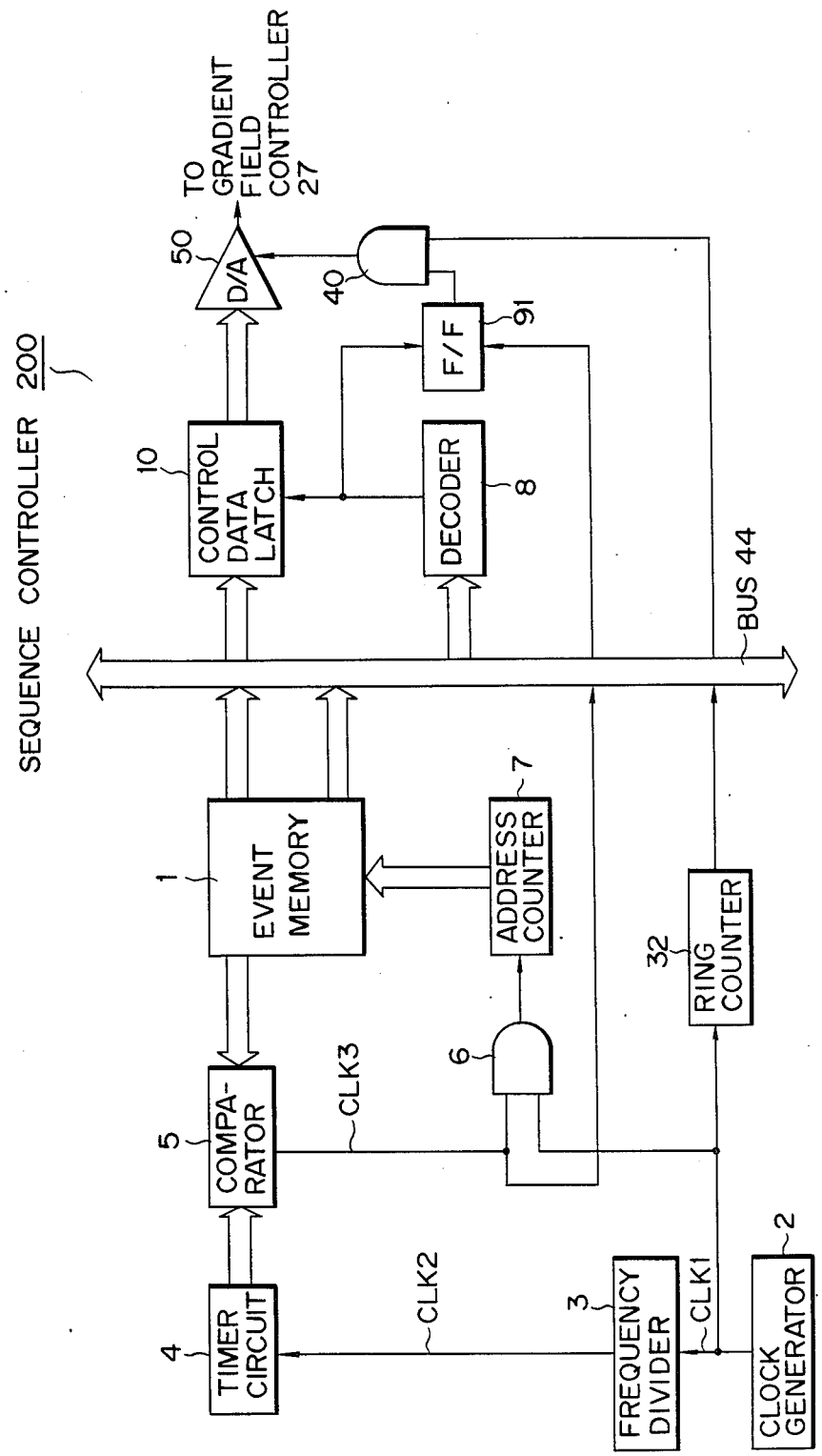

MAGNETIC RESONANCE IMAGING APPARATUS INCLUDING SEQUENCE CONTROLLER

BACKGROUND OF THE INVENTION

1. Field of the Invention

The present invention generally relates to a magnetic resonance imaging apparatus, and more particularly, to a sequence controller capable of controlling the simultaneous execution of several events such as the application of the magnetic field gradients to a body under examination in a magnetic resonance imaging apparatus.

2. Description of the Related Art

The magnetic resonance phenomenon occurs in atomic nuclei having an odd number of protons and/or neutrons. Each such nucleus has a net magnetic moment such that when placed in a static homogeneous magnetic field, H0, a greater number of nuclei align with the H0 field to create a net magnetization, M, in the direction of the field. Net magnetization M is the summation of the individual nuclear magnetic moments. Because a nuclear magnetic moment is the result of a nuclear spin, the terms "nuclear moment" and "nuclear spin" as used herein are synonymous.

Under the influence of the magnetic field H0, the nuclei (and hence the net magnetization M) precess or rottte about the axis of the field. The rate (frequency) at which the nuclei precess is dependent on the strength of the applied magnetic field and on the nuclei characteristics. The angular frequency of precession, $\omega$, is defined as the Larmor frequency and is given by the equation $$\omega = \gamma H0 \qquad (1)$$

in which $\gamma$ is the gyromagnetic ratio (constant for each type of nucleus) and H0 is the strength of the applied static homogeneous magnetic field. The frequency at which the nuclei precess is thus primarily dependent on the strength of the magnetic field H0 and increased with increasing field strength.

A precessing nucleus is capable of absorbing electromagnetic energy. The frequency of the electromagnetic energy needed to induce resonance is the same as the precession frequency $\omega$. During the application of the electromagnetic energy, typically a radio frequency (RF) pulse, the net magnetization M precesses further and further away from the z-axis (arbitrarily assumed to be the direction of the H0 field), depending on the energy and duration of the RF pulse. A 90° RF pulse causes the magnetization M to depart 90° from the direction of the H0 field into the x-y plane defined by the x- and y-axis, for example, of the Cartesian coordinate system. Similarly, a 180° RF pulse causes the magnetization M to reverse direction by 180° from its original direction (from the positive z-axis direction to negative z-axis direction, for example). Following the excitation of the nuclei with RF energy, the absorbed energy is reradiated as an NMR signal as the nuclei return to equilibrium. The energy is emitted as radio waves and also transferred to surrounding molecules.

The above-described magnetic resonance imaging system is known in the art, for instance, from U.S. Pat. No. 4,471,306 to Edelstein et al. issued on Sept. 11, 1984, and U.S. Pat. No. 4,318,043 to Crooks et al. issued on Mar, 2, 1982.

In a conventional magnetic resonance imaging apparatus of this type, a sequence controlling circuit, a so-called "pulse sequencer", is arranged in order to realize a series of sequence control operations as above. In this case, since the sequence control is not always fixed but varies in accordance with imaging methods, the pulse sequencer must be programmable. Therefore, a microcomputer or microprocessor is conventionally used for the pulse sequencer.

However, the processing speed of the microcomputer is not high enough to execute sequence control necessary for high-speed imaging that will be developed in future. Events such as generation of gradient fields are often preferably executed simultaneously in an imaging process. In the conventional pulse sequencer using the microcomputer, a plurality of events cannot be actually executed simultaneously. More specifically, even when simultaneous execution of a plurality of events is desired, a slight time shift must be allowed.

In the sequence controlling circuit such as the pulse sequencer, which is controlled by software of the microcomputer in the conventional magnetic resonance imaging apparatus, high-speed control is inherently hard to attain, and it is also difficult to simultaneously execute a plurality of events.

The present invention has been made in order to solve the conventional problems, and has as its object to provide a magnetic resonance imaging apparatus including a sequence controlling circuit capable of high-speed sequence control and simultaneous execution of a plurality of events.

Another object of the present invention is to provide a magnetic resonance imaging apparatus which can realize a sequence control system by means of hardware, instead of a sequence control system by means of software.

SUMMARY OF THE INVENTION

These objects of the invention are accomplished by providing a magnetic resonance imaging apparatus including at least sequence controlling means, wherein a body is medically examined by utilizing a magnetic resonance phenomenon occurring therein in conjunction with magnetic fields and radio frequency (RF) pulses under control of the sequence controlling means, said sequence controlling means comprising memory means for storing a plurality of data subsets useful for applying the magnetic fields and RF pulses to the body in a predetermined event sequence, each of said data subsets containing event data, time data for performing the event data, and control data for controlling execution of the event data, means for generating reference time data, means for comparing said reference time data generated from the reference time generating means with said time data sequentially read from said memory means within one reference time period, and control means for sequentially controlling an application of the magnetic fields and RF pulses to the body, based upon the event data and control data sequentially read from the memory means, whenever said time data is coincident with said reference time data judged by said comparing means during one reference time period.

BRIEF DESCRIPTION OF THE DRAWINGS

For a better understanding of these objects of the present invention, reference is made to the following detailed description of the invention to be read in conjunction with the following drawings, wherein:

FIG. 4 shows a flowchart of the sequence control operation of the imaging apparatus shown in FIG. 1;

FIG. 6 is a schematic block diagram of the sequence controller according to a second preferred embodiment of the present invention.

DETAILED DESCRIPTION OF THE PREFERRED EMBODIMENTS

GENERAL DESCRIPTION OF MAGNETIC RESONANCE IMAGING APPARATUS INCLUDING SEQUENCE CONTROLLER

The overall arrangement and a series of sequential operations of a magnetic resonance imaging apparatus employing a sequence controller according to the present invention will now be summarized hereinafter.

Figure 1:
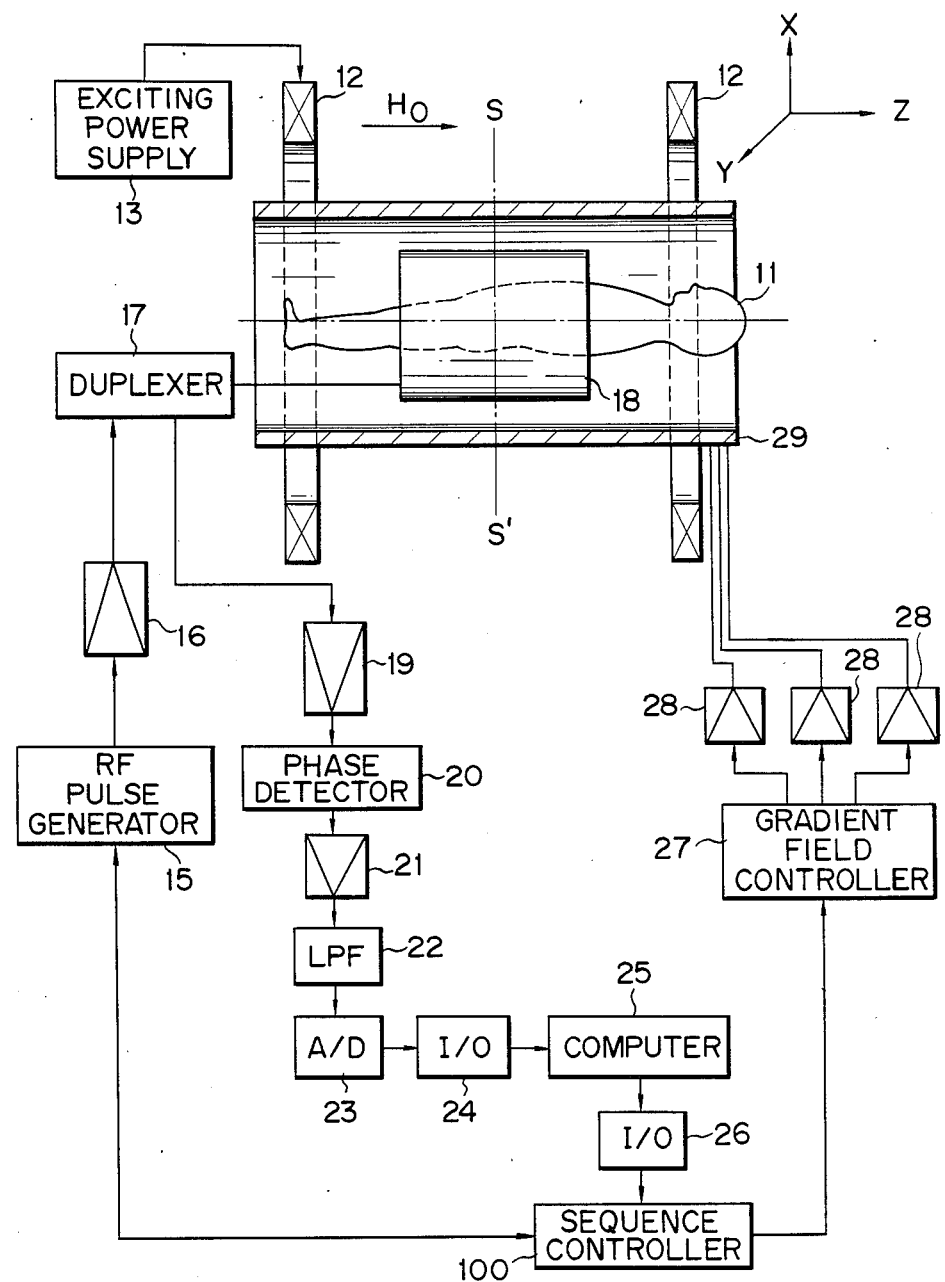
FIG. 1 is a schematic diagram of a magnetic resonance imaging apparatus including a sequence controller according to a first preferred embodiment of the present invention.

Referring to FIG. 1, coil 12 for producing a static field H0 is excited by power from exciting power supply 13, so as to produce a homogeneous static field (HO) in an imaging region of an object (a body) 11 under examination. An RF pulse signal is produced from RF pulse generator 15. An RF pulse signal is modulated by high frequency and its envelop is rectangular, Gaussian or sinc RF pulse generator 15 is controlled by sequence controller 100 of the present invention. The RF pulse signal is amplified to a predetermined level by RF amplifier 16. The amplified RF pulse signal is applied to probe head coil 18 through duplexer 17, thereby forming a rotating magnetic field, for inducing a magnetic resonance phenomenon in object 11. A transverse magnetization which occurs upon application of the rotating magnetic field, is induced as a magnetic resonance signal across both ends of probe head coil 18. In this embodiment, probe head coil 18 is commonly used for a transmitter coil to produce a rotating magnetic field and a receiver coil for receiving a magnetic resonance (MR) signal.

The magnetic resonance signal induced at probe head coil 18 is input to RF amplifier 19 through duplexer 17, and is amplified to a predetermined level. Thereafter, the amplified signal is detected by phase detector 20 by, e.g., quadrature phase detection, so as to be converted to a signal in a video bandwidth. The output signal from phase detector 20 is voltage-amplified by video amplifier 21, and a high-frequency noise component of the signal is removed by low-pass filter 22. The output signal from low-pass filter 22 is converted into a corresponding digital signal by A/D converter 23. The digital signal is supplied to computer 25 through interface 24 so as to be stored therein as image reconstruction data. Note that computer 25 also controls sequence controller 100 through another interface 26.

Determination of slice planes (S-S') within object 11 and phase encoding (more specifically, conversion of positional information within object 11 into the phase of the magnetic resonance signal) are attained by switching the gradient field and then applying the gradient field in a pulsatory form to the body. The switching timing of the gradient field is controlled by pulse sequencer 100 of the present invention (to be described later).

The strength of the gradient field is controlled by gradient field controller 27. More specifically, gradient field controller 27 controls power amplifiers 28A to 28C corresponding to x-, y-, and z-axis gradient fields (in the x-y-z orthogonal coordinate system) so as to energize coil 29. In this manner, the gradient field having a predetermined strength and temporal variation can be produced in the vicinity of the imaging region of object 11.

ARRANGEMENT OF SEQUENCE CONTROLLER

Figure 2:
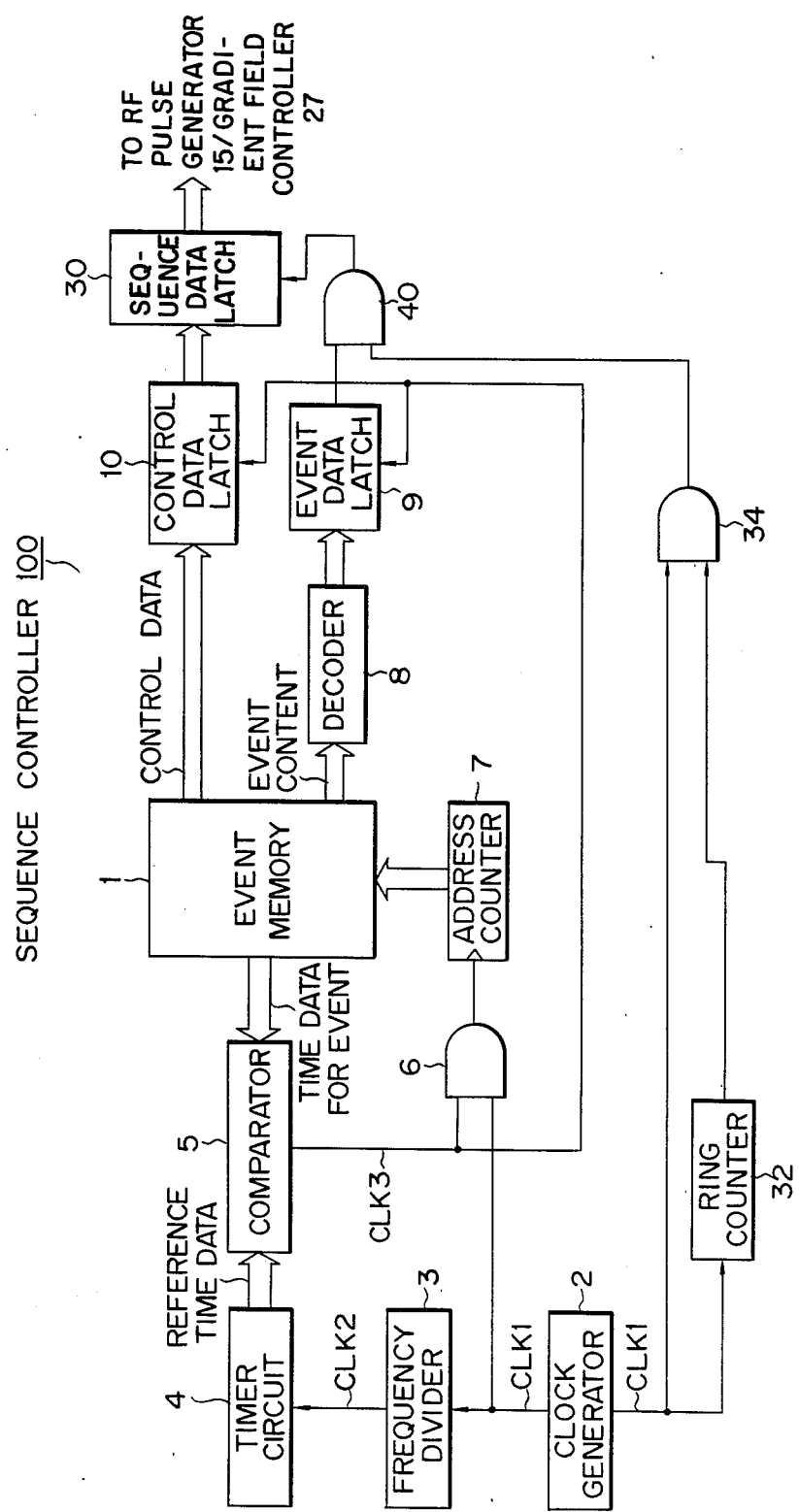
FIG. 2 is a schematic block diagram of the sequence controller shown in FIG. 1.
Figure 3:
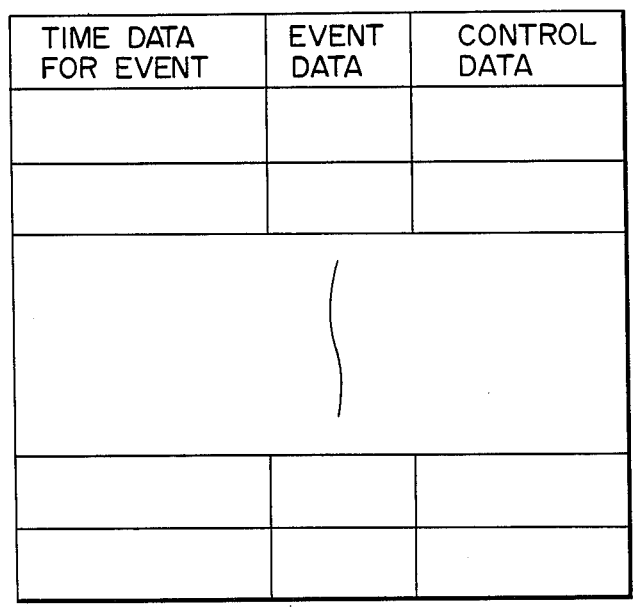
FIG. 3 illustrates memory mapping of the event memory shown in FIG. 2.

Referring now to FIGS. 2 and 3, a sequence controller 100 according to a first preferred embodiment will be described in more detail.

In the sequence controller 100 shown in FIG. 2, event memory 1 stores a plurality of data subsets of event data, time data for event, and control data necessary for execution of event, in units of these three data, as illustrated in memory mapping of FIG. 3. Event memory 1 is constructed by, for example, a RAM (random access memory), in which data is written by the external computer 25 prior to imaging sequence control. Event memory 1 may also be constituted by a ROM.

Clock generator 2 is arranged to produce clock (pulse) signal (to be referred to as first clock signal hereinafter) CLK1 having a predetermined frequency. First clock signal CLK1 is frequency-divided by frequency divider 3 to 1/N (N=integer), e.g., to 1/5, to be converted to second clock (pulse) signal CLK2. This 1/N is a frequency dividing ratio. Second clock signal CLK2 is input to timer circuit 4. Timer circuit 4 produces reference time data synchronous with the cycle of second clock signal CLK2.

The reference time data produced from timer circuit 4 is supplied to one input terminal of comparator 5. The other input terminal of comparator 5 receives time data for event, i.e., time data for initiating an event, read out from event memory 1. The output from comparator 5 is normally set at LOW level, and goes to HIGH level if two input data coincide with each other. The output from comparator 5 is supplied to one input terminal of AND gate 6. The other input terminal of AND gate 6 receives first clock signal CLK1 from clock generator 2. The output from AND gate 6 is input to a clock input terminal of address counter 7 for designating an address.

Of three types of data read out from event memory 1 upon address designation by address counter 7, time data for event is input to comparator 5, as described above, event data is input to decoder 8, and control data is input to control data latch 10. Decoder 8 has the same number of output terminals as the number of events, and outputs data "1" at one output terminal corresponding to event data read out from event memory 1. Event data latch 9 comprises the same number of unit latches (D-type flip-flops) as the number of the events. When event data latch 9 receives a coincidence output from comparator 5 as a latch pulse, it latches the states of the plurality of output terminals of decoder 8. Control data latch 10 also comprises the same number of latches as the number of the events, and latches control data read out from event memory 1 upon reception of a coincidence output from comparator 5 as a latch pulse.

First clock signal CLK1 from clock generator 2 is supplied to ring counter 32, and also supplied to one input terminal of AND gate 34. The output from ring counter 32 is supplied to the other input terminal of AND gate 34. The output from AND gate 34 is supplied to one input terminal of AND gate 40. The other input terminal of AND gate 40 receives the output from event data latch 9. The output from AND gate 40 is supplied as a latch signal to sequence data latch 30 followed control data latch 10. The output from sequence data latch 30 is supplied to RF pulse generator 15 and gradient field controller 27 shown in FIG. 1.

The above-mentioned ring counter 32 counts input first clock signal CLK1, and produces one output pulse upon reception of every five pulses. In response to one output pulse from ring counter 32, sequence data latch 30 outputs control data to, e.g., RF pulse generator 15. More specifically, this output pulse is produced once per cycle of the aforementioned reference time data.

OPERATION OF SEQUENCE CONTROLLER

Referring to a flowchart of FIG. 4, operation of the sequence controller 100 shown in FIG. 2 will now be described.

In the flowchart shown in FIG. 4, if a start instruction is furnished from an external device (step S31), clock generator 2 is energized, and a first address of event memory 1 is designated. Time data for event read out from a memory region (see FIG. 3) corresponding to the first address is compared with reference time data generated from timer circuit 4 to check if both the time data coincide with each other (step S32). If a coincidence is found between both the time data in step S32, event data read out from event memory 1 at that time is decoded and is then latched by event data latch 9, and control data is latched by control data latch 10 (step S33). Then, address counter 7 is incremented (step S34).

When clock generator 2 is energized, ring counter 32 counts first clock signal CLK1 from clock generator 2. It is checked in step S35 if count value i of ring counter 32 has reached N−1. If NO in step S35, the operation returns to step S32. If an incoincidence is found between the time data for event and the reference time data in step S32, the operation jumps to step S35. If it is determined in step S35 that i=N, one or a plurality of events are executed at a timing of i=N in accordance with the event data and the control data latched by event data latch 9 and control data latch 10 (step S36).

The continuous operations from step S32 to S34 are repeated up to (N−1) times as long as a coincidence is detected between both the data in step S32. In other words, a maximum of N−1 events can be simultaneously executed within a cycle of reference time data, in step S36. In this embodiment, 1/N is a frequency dividing ratio of frequency divider 3, and N=5, as described above. Accordingly, a maximum of four events can be simultaneously executed in the preferred embodiment. Each time an event is executed, it is checked in step S37 if the event is a final event. If the event is not a final event, the operation returns to step S32. However, if the final event is detected, all the operation is completed (step S38).

SPIN WARP OPERATION

Figure 5:
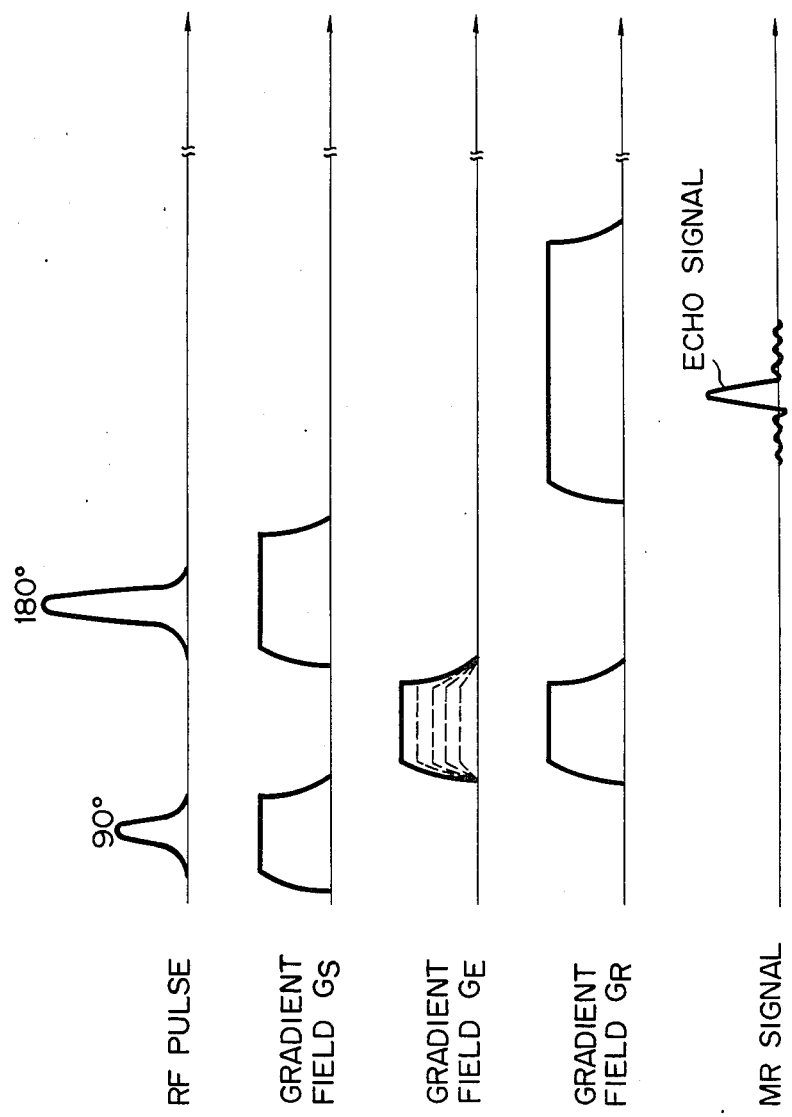
FIG. 5 shows a timing chart of the spin warp method employed in the imaging apparatus shown in FIG. 1.

The operation for acquiring tomographic images of object 11 in which the above-described sequence controller 100 of the present invention is employed in the magnetic resonance imaging apparatus shown in FIG. 1, and the spin warp method proposed by Hutchison et al. is utilized, will now be described. FIG. 5 shows a timing chart of various operations by sequence controller 100.

Determination of slice planes (S-S') in FIG. 1 is performed by gradient field GS (e.g., a magnetic field parallel to the z-axis in FIG. 1). Phase encoding of positional information associated with a first direction (x direction) is performed by gradient field GE. Frequency encoding of positional information associated with a second direction (y direction) perpendicular to the first direction is performed by gradient field GR. In FIG. 5, reference symbol "RF" indicates a timing of RF pulses (90° pulse and 180° pulse) which are applied from RF pulse generator 15 of the imaging apparatus shown in FIG. 1 through probe head coil 18; and MR, a magnetic resonance signal (in FIG. 5, an echo signal is shown). In this embodiment, for these RF pulses, selective RF pulses or non-selective RF pulses are appropriately combined and used, thereby obtaining a desired MR signal.

In the magnetic resonance imaging apparatus shown in FIG. 1, the following sequence control is executed under the control of sequence controller 100 according to the present invention. In this case, computer 25 writes in event memory 1 control data for the RF pulses shown in FIG. 5, event data such as gradient fields GS, GE and GR, instances for executing these events, and other control data necessary for execution of these events (e.g., coil current waveform or instantaneous amplitude data).

At an instance within a certain reference time, if data associated with an event for producing gradient field GS for determining slice plane S-S' (event data, event execution instance data, and control data) are read out from event memory 1, the event data (generation of gradient field GS) is latched by the corresponding unit latch in event data latch 9, and the control data (instantaneous amplitude of gradient field GS) is latched by the corresponding data latch in control data latch 10. These data are read via sequence data latch 30 by gradient field controller 27 at the end of the reference time duration involving the above-described instance so as to generate gradient field GS. As can be seen from FIG. 5, gradient fields GE and GR are often simultaneously generated. In this case, since sequence controller 100 employs the above-described sequence control technique of the present invention such a plurality of events (i.e., generation of gradient fields GE amd GR) can be simultaneously executed.

In the spin warp method of this embodiment, the strength of phase-encoding gradient field GE is required to be changed. Storage and execution (particularly, simultaneous execution with other events) of various control data for changing the strength can be easily realized by utilizing sequence controller 100 of the present invention.

SECOND SEQUENCE CONTROLLER

Sequence controller 200 of a second preferred embodiment will now be described with reference to FIG. 6.

The same reference numerals in FIG. 6 denote the same or equivalent circuit elements shown in FIG. 2, and a detailed description thereof will be omitted.

In sequence controller 200 as illustrated in FIG. 6, clock CLK 3 output from comparator 5 is supplied to a bus 44. When the event data appearing on bus 44 is decoded by decoder 8, it is then stored in a flip-flop 91 in response to third clock CKL 3. At the same time, the control data is transferred via bus 44 to control data latch 10 to be stored therein in response to the output from decoder 8. The first clock signal CLK 1 is supplied to ring counter 32. The output from ring counter 32 is supplied via bus 44 to one input terminal of an AND gate 40. The other input terminal thereof receives the output of flip-flop 91. The output of AND gate 40 is supplied to D/A converter 50. In response to the output of AND gate 40, the data stored in control data latch 10 is digital-to-analog converted. The analog-converted signal is then supplied to gradient field controller 27 and the like as shown in FIG. 1. Thus, the predetermined sequence control operation can be executed.

According to this embodiment since the bus method is employed, circuitry having new functions may be readily coupled to the bus, resulting in an improvement of the system flexibility.

The above-described operation principle of the present invention will now be summarized.

According to the present invention, each time the reference time data is updated, the reference time data is compared with event execution time data in an event memory plural times, and when a coincidence is found, the decoded event is generated based on control data. More specifically, sequence control is not performed in accordance with a predetermined software program unlike using a microcomputer, but one or a plurality of event data to be executed at specific instances within one reference time period and control data necessary for execution of these events are read out upon progress of a time and sequence control is executed based on these data.

The sequence controller according to the present invention can allow high-speed sequence controlling than in a case wherein a microcomputer, i.e., software is utilized. Accordingly, a plurality of events can be simultaneously executed. Therefore, the sequence controller of the present invention is particularly effective for a pulse sequencer in a magnetic resonance imaging apparatus of a high-speed imaging method which will be developed and utilized in near future.

MODIFICATION

The present invention is not limited to the above-described embodiments, and various changes and modifications may be made within the spirit and scope of the invention.

For example, in the embodiment shown in FIG. 2, frequency dividing ratio (1/N) of second clock signal CLK2 for driving timer circuit 4 to first clock signal CLK1 for driving address counter 7 was selected to be 1:5. However, this ratio may be increased as long as the operating speed of hardware allows. If attained, still more events can be simultaneously executed.

Event memory 1 may, of course, store other data in addition to event data, event execution instance data, and control data.

Decoder 8, event data latch 9, control data latch 10, and the like need not always be arranged in sequence controller 100. For example, the content of event memory 1 and the content of address counter 7 are output to control objects such as generation of gradient field controller 27, and can then be decoded and latched thereby.

What is claimed is:

1. A magnetic resonance imaging apparatus including at least sequence controlling means, wherein a body is medically examined by utilizing a magnetic resonance phenomenon occurring therein in conjunction with magnetic fields and radio frequency (RF) pulses under control of the sequence controlling means, said sequence controlling means comprising:

memory means for storing a plurality of data subsets useful for applying the magnetic fields and RF pulses to the body in a sequence of events, at least two of which can occur at the same time, each of said data subsets containing event data for identifying an event, control data for controlling the execution of the events, and time data for indicating a time of the execution of the event;

means for generating reference time data at regular time intervals;

means for comparing said reference time data generated from the reference time generating means with said time data read from said memory means; and control means for controlling an application of the magnetic fields and RF pulses to the body, based upon the event data and control data read from the memory means, if said time data is coincident with said reference time data judged by said comparing means.

2. An apparatus as claimed in claim 1, wherein said reference time generating means includes:

a clock pulse generator for generating a first clock pulse having a first clock frequency;

a frequency divider for dividing the first clock pulse into a second clock pulse having a second frequency lower than that of the first clock pulse at a predetermined frequency-dividing ratio; and a timer circuit for producing said reference time data in synchronism with said second clock pulse.

3. An apparatus as claimed in claim 2, wherein said memory means includes an address counter for designating addresses of said memory means to sequentially read said data subsets, the counting operation of which is controlled in response to the first clock pulse.

4. An apparatus as claimed in claim 2, wherein said control means includes:

a sequence data latch for latching the data subsets sequentially read from said memory means whenever the time data is coincident with the reference time data; and a ring counter for receiving the first clock pulse and for supplying a latch pulse to the sequence data latch whenever the number of the received first clock pulses reaches said frequency dividing ratio, thereby outputting the latched data subsets from the sequence data latch.

5. An apparatus as claimed in claim 4, wherein said control means further includes:

a decoder for decoding said event data sequentially stored in the memory means; and an event data latch for latching the decoded event data received from the decoder whenever said time data is coincident with said reference time data judged by said comparing means.

6. An apparatus as claimed in claim 2, wherein said control means includes:

a data bus;

a control data latch for latching the data subsets sequentially read from said memory means via the data bus whenever the time data is coincident with the reference time data;

a ring counter for receiving the first clock pulse and for generating a latch pulse whenever the number of the received first clock pulses reaches said predetermined frequency-dividing ratio;

a digital-to-analog converter for converting said data subsets into corresponding analog data subsets in response to the latch pulse sent from the ring counter via the data bus.

7. An apparatus as claimed in claim 2, wherein said frequency dividing ratio is selected to be 5.

* * * * *